United States Patent [19]

Takoshima et al.

[11] Patent Number: 4,736,128
[45] Date of Patent: Apr. 5, 1988

[54] SURFACE ACOUSTIC WAVE DEVICE

[75] Inventors: Takehiro Takoshima; Takehiko Sone, both of Furukawa, Japan

[73] Assignee: Alps Electric Co., Ltd., Japan

[21] Appl. No.: 941,161

[22] Filed: Dec. 12, 1986

[30] Foreign Application Priority Data

Jan. 28, 1986 [JP] Japan .................................. 61-16093

[51] Int. Cl.⁴ ............................................. H01L 41/08
[52] U.S. Cl. ................................. 310/313 R; 333/150; 333/193; 310/313 D; 310/348
[58] Field of Search ............... 310/313, 340, 344, 345, 310/348; 333/150–155, 193–196

[56] References Cited

U.S. PATENT DOCUMENTS 4,243,960  1/1981  White et al. .................. 310/313 R
4,617,487 10/1986  Sone et al. ................... 310/313 D

FOREIGN PATENT DOCUMENTS 0138115  8/1983  Japan .................................. 333/195
0139513  8/1983  Japan .............................. 310/313 R
0090416  5/1985  Japan .................................. 333/195

*Primary Examiner*—Mark O. Budd
*Attorney, Agent, or Firm*—Guy W. Shoup

[57] ABSTRACT

A surface acoustic wave device comprising a device body and a multilayer printed board. The body has a piezoelectric substrate on which arrays of strip electrodes are formed. The body is covered with an insulating film except for locations where terminals are formed. The printed board is spaced a given distance from the body. The terminals of the printed board are connected via a solder layer with the terminals of the device body.

7 Claims, 2 Drawing Sheets

SURFACE ACOUSTIC WAVE DEVICE

FIELD OF THE INVENTION

The present invention relates to a surface acoustic wave (SAW) device that finds use as a delay line, oscillator, filter, or the like.

BACKGROUND OF THE INVENTION

In the past, SAW devices were used in military, or special, applications. In recent years, SAW devices have found use in civil applications, such as FM tuners and TV receivers, and have attracted much interest rapidly. SAW devices are manufactured as delay lines, oscillators, filters, etc. The features of these various SAW devices are that they are small in size, light in weight, have high reliability, and can be fabricated by processes similar to those used in the case of integrated circuits. Hence, they can be easily mass-produced. Today, SAW devices are mass-produced as electronic parts indispensable to the industry.

By way of example of the prior art SAW device, a surface acoustic wave (SAW) resonator is now described. This resonator comprises a piezoelectric substrate on which arrays of strip electrodes made from an electrically conductive material are formed. Two similar lattice-like reflectors each consisting of dielectric substance, conductive substance, grooves, and ridges are formed on opposite sides of the electrode arrays. When a voltage of a certain frequency is applied to the electrodes, an electric field is applied to the surface of the piezoelectric substrate in the gaps between the electrodes. Then, a mechanical distortion is produced in proportion to the voltage because of the piezoelectricity of the piezoelectric substrate. The distortion propagates in both directions as surface waves at an acoustic velocity determined by the material of the piezoelectric substrate. The surface waves are reflected by the reflectors on both sides back to the strip electrodes, causing the electrodes to resonate.

Generally, these various SAW devices are hermetically sealed in metallic containers to remove external noise. Taking account of hermetic seal and resistance to errosion, the containers are usually plated with nickel or other metal.

In these SAW devices, conductive foreign matter intruded before the containers are hermetically sealed or matter peeling off from the plating of the containers may adhere to the strip electrodes, causing short circuits between the electrodes. This varies the electric impedance or presents other problems. As a result, the reliability of the SAW devices deteriorates, making it difficult to mass-produce them.

Japanese Patent Laid-Open No. 3957/1984 discloses an invention of a hermetically sealed electronic part package which comprises a circuit substrate, a vibrator installed on the substrate, and a casing mounted over the vibrator. Japanese Utility Model Laid-Open No. 78935/1978 discloses an SAW device comprising a piezoelectric substrate, electrodes formed on the substrate, a solder layer formed around the surface of the substrate on which the electrodes are formed, a sheetlike object having lead wires extending from the electrodes, and another solder layer formed around the sheetlike object. The sheetlike object is placed on, and bonded with adhesive to, the substrate.

In these SAW devices, the surface on which the electrodes are formed is hermetically sealed by the casing or sheetlike object. Therefore, a peripheral circuit for exciting the device must be formed on a separate substrate.

SUMMARY OF THE INVENTION

It is the object of the present invention to provide a surface acoustic wave (SAW) device which can be fabricated with high reliability by preventing foreign matter from intruding into the device, and which is easy to design and assemble so that a peripheral circuit for driving the device may also be incorporated into the device.

The SAW device according to the invention comprises: a device body having a piezoelectric substrate on which at least one pair of strip electrodes is formed, the device body having terminals, the surface of the device body on which the electrodes are formed being covered with an insulating film except for the terminals; and a printed board disposed opposite to the surface of the device body on which the electrodes are formed, the board having terminals which are coupled to the terminals of the device body, the insulating film being spaced a given distance from the printed board.

In this way, in the novel device, the body of the device is covered with the insulating film except for the terminals on the surface on which the electrodes are formed. Therefore, short circuits between the electrodes which would have been caused by adhesion of conductive foreign matter, such as metal particles, can be prevented. This enhances the reliability of the device. Since the surface having the electrodes is covered with the insulating film, it might be considered that the surface acoustic waves are attenuated, resulting in a deterioration in characteristics. However, in many cases, no practical problems arise. Also, special waves, especially bulk waves traveling in close proximity to the surface of the piezoelectric substrate, are not greatly attenuated. Hence, no practical difficulties take place. Further, it is quite unlikely that foreign matter invades or contacts the surface having the electrodes, because the wiring board is disposed opposite to the surface having the electrodes. Consequently, the device can be handled easily. A certain gap is formed between the insulating film on the surface having the electrodes and the wiring board to prevent the characteristics of the SAW device from deteriorating. Furthermore, as the terminals of the body of the device are directly connected to the terminals of the wiring board, a peripheral circuit for driving the device can be formed on the wiring board to make an integrated circuit. This makes it easy to design and assemble the device.

In a preferred embodiment of the invention, the terminals of the wiring board are coupled to the terminals of the body of the device via a solder layer. Hence, the terminals of the board and of the body are certainly connected together. Also, the solder layer absorbs stresses caused by thermal expansion, enhancing the thermal resistance of the device.

In one preferred aspect of the invention, the insulating film is made from at least one selected from the group consisting of $SiO_2$, $Si_3N_4$, $Ta_2O_5$, $Al_2O_3$, $ZrO_2$, $TiO_2$, and TaN. These materials can minimize the deterioration in characteristics of the SAW device. In this case, the insulating film is preferably about 0.1 to 0.5 $\mu m$ thick.

DETAILED DESCRIPTION OF THE INVENTION

Figure 1:
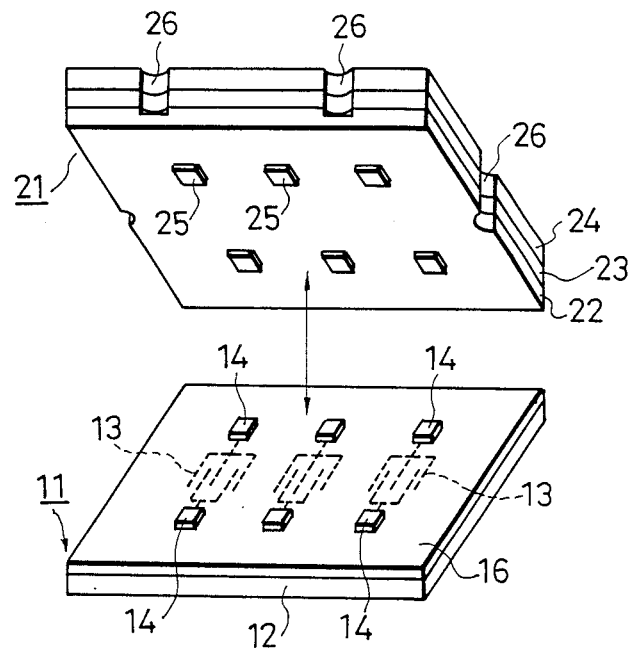
FIG. 1 is an exploded perspective view of a surface acoustic wave device according to the invention.
Figure 2:
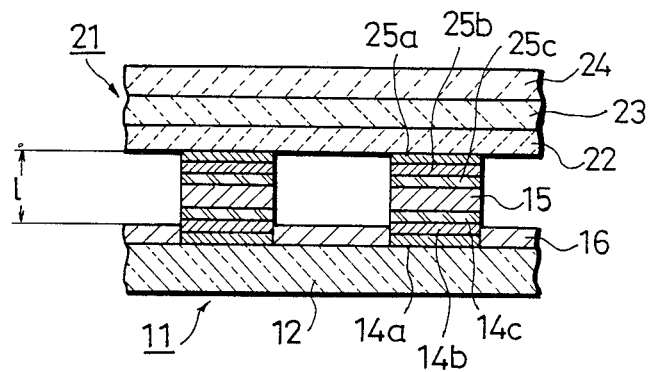
FIG. 2 is a fragmentary cross section of the device shown in FIG. 1.

Referring to FIGS. 1 and 2, there is shown a surface acoustic wave (SAW) device embodying the concept of the invention. This device consists of a device body 11 and a multilayer printed board 21. As shown in FIG. 2, the body 11 comprises a piezoelectric substrate 12 on which a plurality of arrays of strip electrodes 13 are formed. Each array of the electrodes 13 has electrodes 14. In reality, as shown in FIG. 2, each terminal 14 comprises a film 14a of aluminum patterned on the substrate 12, a film 14b of zinc formed on the film 14a, and a film 14c of nickel formed on the film 14b. Therefore, solder 15 can be easily applied. The surface of the substrate 12 on which the electrodes are formed is covered with an insulating film 16 except for the terminals 14. In this example, the film 16 is made from SiO$_2$ and 0.3 μm thick.

Figure 3:
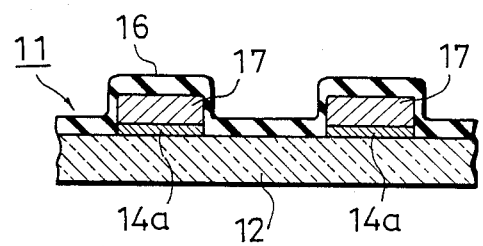
FIG. 3 is a cross-sectional view of the device shown in FIGS. 1 and 2, for illustrating one method by which an insulating film is formed.

Referring next to FIG. 3, the insulating film 16 can be formed on the surface except for the terminals 14 by the lift-off method. Specifically, the pattern of the aluminum film 14a is formed on the substrate 12. Then, a resist 17 is formed on those portions of the aluminum film 12 on which terminals are formed. Subsequently, the insulating film 16 is formed on the whole surface of the resist 17. The film 16 is then removed at those portions to expose the aluminum film 14a, thus forming the terminals.

Figure 4:
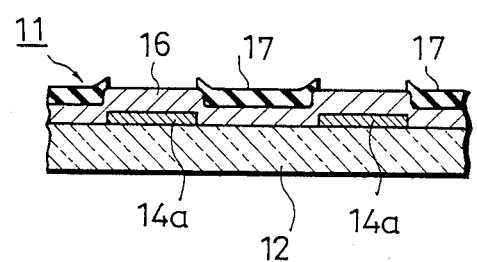
FIG. 4 is a cross-sectional view of the device shown in FIGS. 1 and 2, for illustrating another method by which an insulating film is formed.

Another method of forming the terminals is now described by referring to FIG. 4. The pattern of the aluminum film 14a is formed on the piezoelectric substrate 12. An insulating film 16 is formed on the whole surface of the pattern 14a. Thereafter, the resist 17 is formed on the film 16 except for those portions of the aluminum film 14a on which the terminals are to be formed. Those portions of the insulating film 16 which are not covered with the resist 17 are etched out to expose those portions of the aluminum film 14a which form the terminals.

The multilayer printed board 21 is a lamination of plural substrates, three substrates 22, 23, 24 in this example. Terminals 24 corresponding to the terminals 14 of the device body 11 are formed on the lowest substrate 22. As shown in FIG. 2, each terminal 25 comprises a film 25a of aluminum patterned on the substrate 22, a film 25b of zinc formed on the film 25a, and a film 25c of nickel formed on the film 25b. Thus, it is easy to apply solder 15 to the terminal. Circuit patterns constituting peripheral circuits (not shown), e.g., tuning circuits and matching circuits, are formed on the substrates 22–24. The side walls of the board 21 have holes 26 extending through them, the holes 26 being semicircular in cross section. These holes 26 are connected with the terminals of external circuit substrates (not shown).

The terminals 14 of the device body 11 are coupled via the solder layer 15 to the terminals 25 of the printed board 21 to form a surface acoustic wave (SAW) device according to the invention. In this case, a certain gap l is left between the surface of the insulating film 16 on the device body 11 and the surface of the printed board 21. The requirement is only that the gap is more than approximately 1 μm.

In this SAW device, the strip electrodes 13 are covered with the insulating film 16 and, therefore, external conductive foreign matter does not adhere to the electrodes. Thus, short circuits do not occur between the electrodes 13. This enhances the reliability of the device. Also, since the terminals 25 of the multilayer printed board 21 are directly connected with the terminals 14 of the device body 11, a peripheral circuit can be formed on the printed board 21. Hence, the device is easy to design and assemble so that it may be connected with an external circuit.

In the above example, the multilayer printed board 21 is used. Instead of this, a flexible printed circuit or the like may be employed. Also in the above example, the terminals 25 of the printed board 21 are coupled with solder 15 to the terminals 14 of the device body 11. If the terminals 14 and 25 are made from aluminum, gold, or other material, they can be directly coupled together by thermocompression bonding.

As described thus far, in the novel SAW device, the surface of the device body on which the electrodes are formed is covered with the insulating film except for the terminals. Therefore, conductive foreign matter does not adhere to the device. Hence, short circuits do not occur between the electrodes. Since the terminals of the printed board are directly connected with the terminals of the device body, a peripheral circuit can be formed on the printed circuit, whereby the peripheral circuit can be integrated with the device. This makes it easy to design and assemble the device so that it may be connected with external circuits.

What is claimed is:

1. A surface acoustic wave device comprising:

a device body having a piezoelectric substrate on which at least one pair of strip electrodes is formed on a planar surface of the substrate which is of a given area, the device body having a first plurality of terminals connected to respective ones of the strip electrodes and disposed within the area of the surface and projecting perpendicularly a predetermined distance from the surface, the surface of the device body on which the electrodes are formed being covered with an insulating film over the given area except for the first plurality of terminals; and a printed board having a planar surface which is of a given area disposed opposite to the surface of the device body on which the electrodes are formed, the board having a second plurality of terminals, corresponding in location to the first plurality of terminals and projecting perpendicularly a predetermined distance from the board surface, which are physically and electrically coupled to the first terminals of the device body, the substrate surface, electrodes, and insulating film of the device body thereby being spaced a given distance from the opposing surface of the printed board by the perpendicularly projecting distances of the first and second terminals.

2. A surface acoustic wave device as set forth in claim 1, wherein the terminals of the printed board are connected with the terminals of the device body by soldering.

3. A surface acoustic wave device as set forth in claim 1, wherein the insulating film is made from at least one material selected from the group consisting of $SiO_2$, $Si_3N_4$, $Ta_2O_5$, $Al_2O_3$, $ZrO_2$, $TiO_2$, and TaN.

4. A surface acoustic wave device as set forth in claim 1, wherein the printed board is a multilayer printed board.

5. A surface acoustic wave device as set forth in claim 2, wherein the insulating film is made from at least one material selected from the group consisting of $SiO_2$, $Si_3N_4$, $Ta_2O_5$, $Al_2O_3$, $ZrO_2$, $TiO_2$, and TaN.

6. A surface acoustic wave device as set forth in claim 2, wherein the printed board is a multilayer printed board.

7. A surface acoustic wave device as set forth in claim 3, wherein the printed board is a multilayer printed board.

* * * * *